US009344096B2

(12) United States Patent
Huang et al.

(10) Patent No.: US 9,344,096 B2
(45) Date of Patent: May 17, 2016

(54) METHOD FOR DETECTING FREQUENCY OFFSET OF OSCILLATOR AND ASSOCIATED CIRCUIT

(71) Applicant: Realtek Semiconductor Corp., HsinChu (TW)

(72) Inventors: Ming-Chung Huang, Taichung (TW); Xinglong Liu, Daqing (CN)

(73) Assignee: Realtek Semiconductor Corp., Science Park, HsinChu (TW)

( * ) Notice: Subject to any disclaimer, the term of this patent is extended or adjusted under 35 U.S.C. 154(b) by 0 days.

(21) Appl. No.: 14/447,599

(22) Filed: Jul. 30, 2014

(65) Prior Publication Data

US 2015/0042407 A1  Feb. 12, 2015

(30) Foreign Application Priority Data

Aug. 12, 2013  (CN) .......................... 2013 1 0350351

(51) Int. Cl.
- *H03L 1/02* (2006.01)
- *H03B 5/32* (2006.01)
- *H03L 7/185* (2006.01)
- *H04B 10/60* (2013.01)

(52) U.S. Cl.
CPC ...... *H03L 1/026* (2013.01); *H03B 5/32* (2013.01); *H03L 1/027* (2013.01); *H03L 1/028* (2013.01); *H03L 7/185* (2013.01); *H04B 10/60* (2013.01)

(58) Field of Classification Search
CPC ............ H03B 5/30; H03B 5/32; H03B 19/00; H03B 19/10; H03B 21/00–21/02; H03L 1/02; H03L 1/026–1/028; H03L 7/18; H03L 7/185
USPC ............ 331/18, 30, 37, 40–44, 158, 175, 176
See application file for complete search history.

(56) References Cited

U.S. PATENT DOCUMENTS

| | | | | |
|---|---|---|---|---|
| 3,401,353 A | * | 9/1968 | Hughes | 331/11 |
| 3,696,422 A | * | 10/1972 | Burrell | 342/385 |
| 4,360,788 A | * | 11/1982 | Erps et al. | 331/1 A |
| 4,994,762 A | * | 2/1991 | Tay | 331/2 |
| 5,128,633 A | * | 7/1992 | Martin et al. | 331/2 |

(Continued)

FOREIGN PATENT DOCUMENTS

| | | |
|---|---|---|
| TW | 469719 | 12/2001 |
| TW | 507424 | 10/2002 |

*Primary Examiner* — Levi Gannon
(74) *Attorney, Agent, or Firm* — Winston Hsu; Scott Margo

(57) ABSTRACT

A method for detecting frequency offset of an oscillator includes: receiving an oscillation signal having an oscillation frequency; generating a self-mixing signal according to the oscillation signal; performing frequency division upon the self-mixing signal to obtain a down-converted self-mixing signal; obtaining a down-converted self-mixing frequency corresponding to a maximum power in a specific frequency range of the down-converted self-mixing signal; and computing a frequency offset of the oscillation frequency according to at least the oscillation frequency and the down-converted self-mixing frequency. A related circuit is also disclosed.

19 Claims, 7 Drawing Sheets

(56) References Cited

U.S. PATENT DOCUMENTS

| | | | |
|---|---|---|---|
| 5,717,730 A * | 2/1998 | Prakash et al. | 375/376 |
| 5,831,481 A * | 11/1998 | Oga | 331/1 A |
| 5,856,766 A * | 1/1999 | Gillig et al. | 331/176 |
| 6,658,237 B1 | 12/2003 | Rozenblit | |
| 6,960,962 B2 | 11/2005 | Peterzell | |
| 7,205,798 B1 * | 4/2007 | Agarwal et al. | 327/105 |
| 8,442,474 B2 | 5/2013 | Rao | |
| 2002/0030546 A1 * | 3/2002 | Keating | 331/2 |
| 2002/0030549 A1 | 3/2002 | Umegaki | |
| 2012/0303307 A1 * | 11/2012 | Huang | 702/77 |

* cited by examiner

US 9,344,096 B2

METHOD FOR DETECTING FREQUENCY OFFSET OF OSCILLATOR AND ASSOCIATED CIRCUIT

BACKGROUND OF THE INVENTION

1. Field of the Invention

The disclosed embodiments of the present invention relate to an oscillation circuit, and more particularly, to a method for detecting frequency offset of an oscillator, and an associated circuit.

2. Description of the Prior Art

FIG. 1 is a chart illustrating an oscillation frequency output by a crystal oscillator with respect to temperature. When there is a change in temperature, the oscillation frequency will inevitably deviate from a target frequency. As shown in FIG. 1, the curve of the oscillation frequency versus the corresponding temperature is S-shaped, i.e. an S curve. The offset of the oscillation frequency affects electronic devices, especially for systems or applications which have a low tolerance for frequency offset, such as Global Positioning Systems (GPS).

A conventional compensation method for frequency offset is the application of a temperature compensated crystal oscillator (TCXO). When the TCXO is manufactured, an S curve of a crystal oscillator is derived and saved in an external chip in advance. The chip can further compute an inverse curve against the S curve and generate a model accordingly, to exactly compensate the frequency offset of the crystal oscillator. The TCXO is uneconomical in manufacturing terms, however, and if the S curve of the crystal oscillator changes, the external chip may fail to compensate the frequency offset precisely with repeated use, as the stored S curve is a fixed curve. In other words, the conventional TCXO has a limited lifetime. Another prior art compensation method measures the S curve and then compensates by utilizing external digital circuits. This method has the shortcomings of a complicated control mechanism, and also has a limited lifetime.

Therefore, there is a need for a novel frequency offset detection mechanism capable of computing frequency offset of a crystal oscillator without deriving an S curve of the crystal oscillator in advance, and compensating the crystal oscillator based on the computed frequency offset.

SUMMARY OF THE INVENTION

One of the objectives of the present invention is to provide a method for detecting frequency offset of an oscillator, and to provide an associated circuit to solve the above-mentioned issues.

According to a first aspect of the present invention, a method for detecting frequency offset of an oscillator is disclosed. The method comprises: receiving an oscillation signal having an oscillation frequency; generating a self-mixing signal according to the oscillation signal; performing frequency division upon the self-mixing signal to obtain a down-converted self-mixing signal; obtaining a down-converted self-mixing frequency corresponding to a maximum power in a specific frequency range of the down-converted self-mixing signal; and computing a frequency offset of the oscillation frequency according to at least the oscillation frequency and the down-converted self-mixing frequency.

According to a second aspect of the present invention, a circuit for detecting frequency offset of an oscillator is disclosed. The circuit comprises a self-mixer, a frequency divider and a control circuit. The self-mixer is arranged to generate a self-mixing signal according to a received oscillation signal having an oscillation frequency. The frequency divider is arranged to perform frequency division upon the self-mixing signal to obtain a down-converted self-mixing signal. The control circuit is arranged to obtain a down-converted self-mixing frequency corresponding to a maximum power in a specific frequency range of the down-converted self-mixing signal, and compute a frequency offset of the oscillation frequency according to at least the oscillation frequency and the down-converted self-mixing frequency.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "coupled" is intended to mean either an indirect or direct electrical connection. Accordingly, if one device is coupled to another device, that connection may be through a direct electrical connection, or through an indirect electrical connection via other devices and connections.

Figure 1:
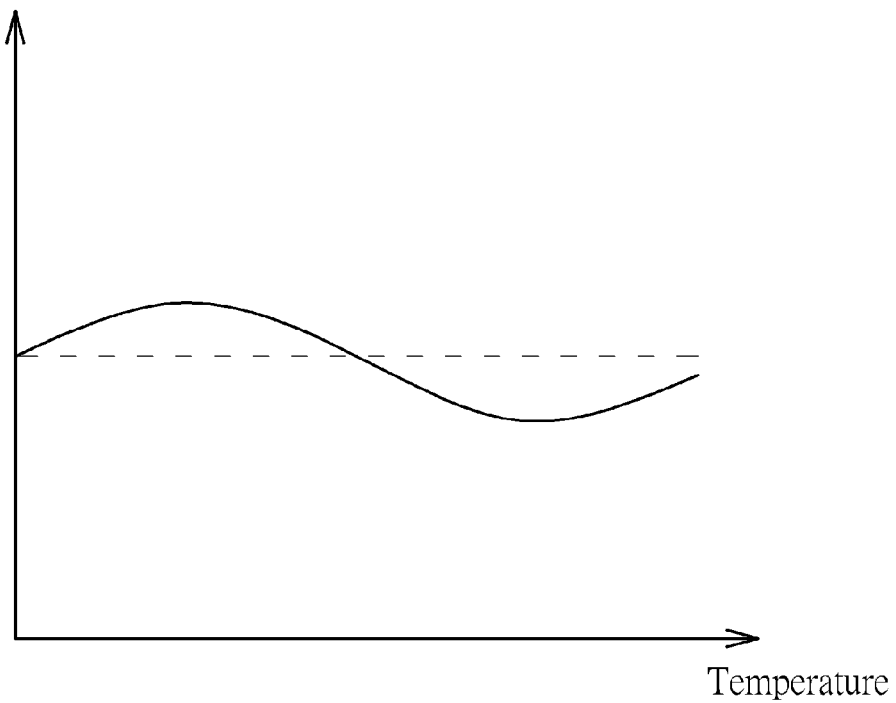
FIG. 1 is a chart illustrating an oscillation frequency output by a crystal oscillator with respect to temperature.
Figure 2:
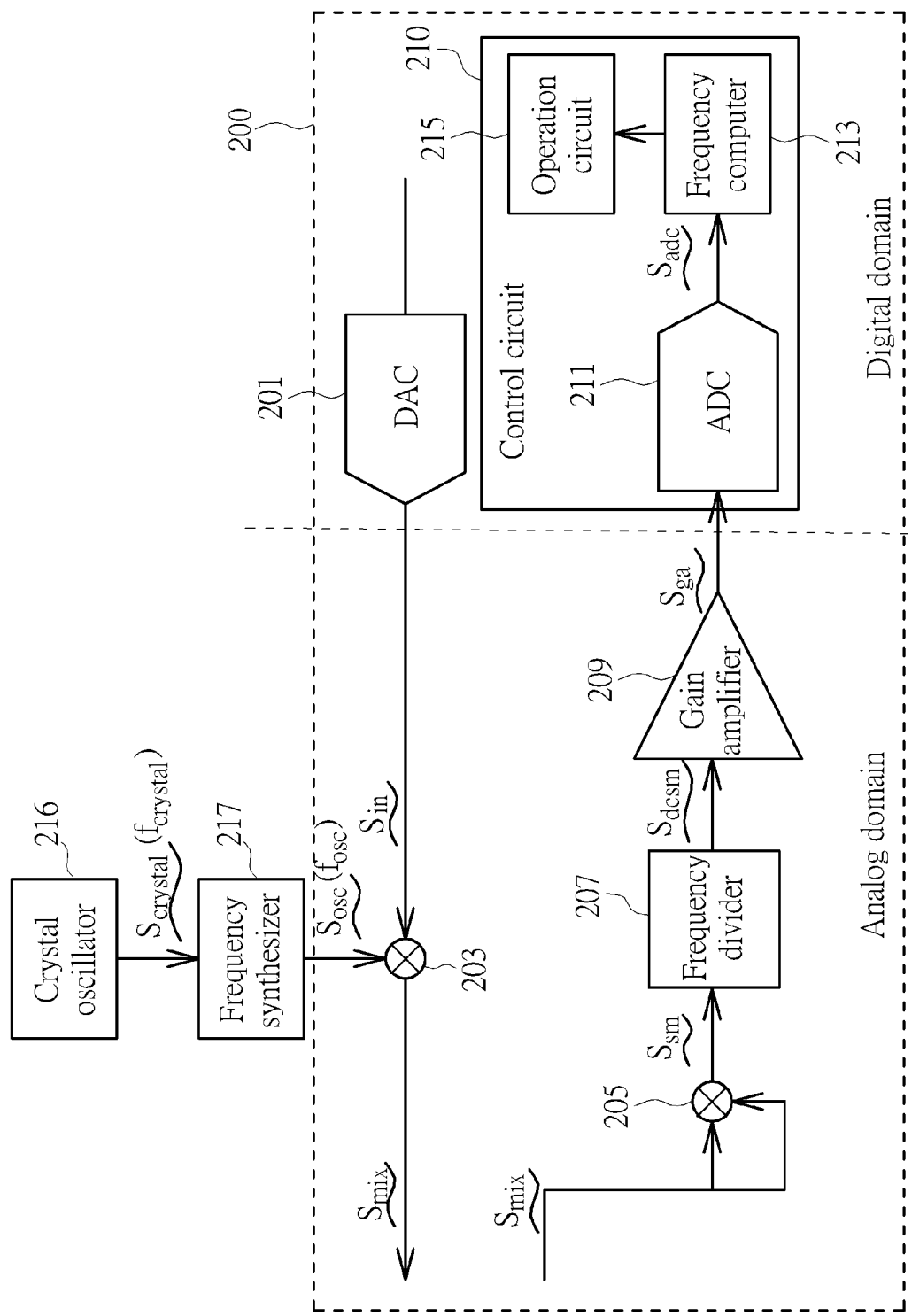
FIG. 2 is a diagram illustrating a circuit for detecting frequency offset of an oscillator according to a first embodiment of the present invention.

FIG. 2 is a diagram illustrating a circuit for detecting frequency offset of an oscillator according to a first embodiment of the present invention. In this embodiment, the oscillation frequency offset detection circuit 200 includes a digital-to-analog converter (DAC) 201, a mixer 203, a self-mixer 205, a frequency divider 207, a gain amplifier 209 and a control circuit 210. The control circuit 210 includes an analog-to-digital converter (ADC) 211, a frequency computer 213 and an operation circuit 215. The mixer 203 is for mixing an oscillation signal $S_{osc}$ and an input signal $S_{in}$, which has an input frequency $f_{in}$ and is obtained from the output of the DAC 201, to generate a mixed signal $S_{mix}$, wherein the oscillation signal $S_{osc}$ has an oscillation frequency $f_{osc}$. The mixed signal $S_{mix}$ is then transmitted to the self-mixer 205 (e.g. byway of coupling), and the mixed signal $S_{mix}$ is self-mixed to generate a self-mixing signal $S_{sm}$. The frequency divider 207 having a frequency division factor performs frequency division upon the self-mixing signal $S_{sm}$, and generates a down-converted self-mixing signal $S_{dcsm}$. The gain amplifier 209 subsequently adjusts the amplitude of the down-converted self-mixing signal $S_{dcsm}$ to an appropriate range, to prevent saturation or poor utilization in the following ADC 211. A gain amplified signal $S_{ga}$ output by the gain amplifier 209 in an analog domain is converted to an ADC signal $S_{adc}$ in a digital domain by the ADC 211. The frequency computer 213 is utilized to perform Fourier transform upon the ADC signal $S_{adc}$ for deriving a down-converted self-mixing frequency $f_{dcsm}$ corresponding to a maximum power in a specific frequency range. The operation circuit 215 is capable of deriving a frequency offset $f_s$ according to at least the down-converted self-mixing frequency $f_{dcsm}$, the frequency division factor N and the oscillation frequency $f_{osc}$. For instance, it is feasible to apply a Fourier transformer with respect to the ADC signal $S_{adc}$ for the down-converted self-mixing frequency $f_{dcsm}$ corresponding to a maximum power in a specific frequency range. In an alternative design, a pattern correlation may be processed for the ADC signal $S_{adc}$ based on a plurality of predetermined frequencies, so as to derive the down-converted self-mixing frequency $f_{dcsm}$ corresponding to a maximum power in a specific frequency range. Please note that the invention is not limited to the method of obtaining the down-converted self-mixing frequency $f_{dcsm}$ corresponding to the maximum power in the specific frequency range, and any other method which is able to derive the main frequency also falls within the scope of the invention, such as a modified version of the typical Fourier transform or the typical pattern correlation. In this exemplary embodiment, a crystal oscillator 216 outputs a crystal oscillator signal $S_{crystal}$ with a crystal oscillator frequency $f_{crystal}$. The frequency synthesizer 217 doubles the crystal oscillator frequency $f_{crystal}$ to the oscillation frequency $f_{osc}$, i.e. the oscillation signal $S_{osc}$. A frequency offset of the crystal oscillator signal $S_{crystal}$ therefore becomes a doubled frequency offset through the process of the frequency synthesizer 217. It should be noted that the frequency offset $f_s$ here refers to the doubled frequency offset.

The input signal $S_{in}$ and the oscillation frequency $f_{osc}$ are mixed by the mixer 203 to produce the mixed signal $S_{mix}$. The process can be expressed by the following equations.

$$S_{in} = \cos(2\pi f_{in} t)$$

$$S_{osc} = \cos(2\pi f_{osc} t)$$

$$S_{mix} = \cos(2\pi f_{in} t) * \cos[2\pi (f_{osc}) t]$$

When the frequency offset $f_s$ is incorporated into the oscillation signal $S_{osc}$, the process of generation of the mixed signal $S_{mix}$ can be expressed by the following equations.

$$S_{mix} = \cos(2\pi f_{in} t) * \cos[2\pi (f_{osc} + f_s) t]$$

$$= \frac{1}{2}\{\cos[2\pi(f_{in} - f_{osc} - f_s)t] + \cos[2\pi(f_{in} + f_{osc} + f_s)t]\}$$

To derive the self-mixed signal $S_{sm}$ produced by the self-mixer 205 which performs self-mixing upon the mixed signal $S_{mix}$, the above equations can be arranged as:

$$a = c = \cos[2\pi(f_{in} - f_{osc} - f_s)t]$$

$$b = d = \cos[2\pi(f_{in} + f_{osc} + f_s)t]$$

The self-mixed signal $S_{sm}$ is given by:

$$S_{sm} = S_{mix} * S_{mix} = \frac{1}{2}(a+b) * \frac{1}{2}(c+d)$$

$$= \frac{1}{4}(ac + ad + bc + bd)$$

wherein:

$$ac = \frac{1}{2}\{1 + \cos[2\pi * 2(f_{in} - f_{osc} - f_s)t]\}$$

$$ad = \frac{1}{2}\{\cos[2\pi * 2(-2f_{osc} - 2f_s)t] + \cos(2\pi * 2f_{in}t)\}$$

$$bc = \frac{1}{2}\{\cos[2\pi * 2(2f_{osc} + 2f_s)t] + \cos(2\pi * 2f_{in}t)\}$$

$$bd = \frac{1}{2}\{1 + \cos[2\pi * 2(f_{in} + f_{osc} + f_s)t]\}$$

$$ac + bd = 1 + \frac{1}{2}\left\{\begin{array}{l}\cos[2\pi * 2(f_{in} - f_{osc} - f_s)t] + \\ \cos[2\pi * 2(f_{in} + f_{osc} + f_s)t]\end{array}\right\}$$

$$= 1 + \frac{1}{2}\left\{\begin{array}{l}\cos[2\pi(2f_{osc} + 2f_s - f_{in})t] + \\ \cos[2\pi(2f_{osc} + 2f_s + 2f_{in})t]\end{array}\right\}$$

$$ad + bc = \cos[2\pi * 2(2f_{osc} + 2f_s)t] + \cos(2\pi * 2f_{in}t)$$

According to the above equations, the self-mixed signal $S_{sm}$ includes 5 frequency components, i.e. a first frequency, a second frequency, a third frequency, a fourth frequency and a fifth frequency. Specifically, the first frequency is the DC component, the second frequency is $2*f_{in}$ (doubled input frequency $f_{in}$), the third frequency is $2*f_{osc} + 2*f_s - 2*f_{in}$, the fourth frequency is $2*f_{osc} + 2*f_s$, and the fifth frequency is $2*f_{osc} + 2*f_s + 2*f_{in}$. Among the five frequency components, the third, the fourth and the fifth frequencies possess information regarding the frequency offset $f_s$. Therefore, the third, the fourth and the fifth frequencies should be considered when deriving the frequency offset $f_s$.

The exemplary embodiment intends to use the digital signal processing (DSP) for detecting, for frequency offset $f_s$ detection and for compensation. The self-mixed signal $S_{sm}$ therefore needs to be transformed to the digital domain. Since the oscillation frequency $f_{osc}$ of the oscillation signal $S_{osc}$ is a doubled frequency of the crystal oscillator signal $S_{crystal}$, the oscillation frequency $f_{osc}$ is relatively high. In practice, the ADC with a required number of bits is difficult to operate at this high an operating frequency (the oscillation frequency $f_{osc}$) for data sampling. The frequency divider 207 needs to be utilized to down convert the self-mixed signal $S_{sm}$ by the frequency division factor N, so that the frequency of the self-mixed signal $S_{sm}$ can be cut down to a reasonable frequency range. The five frequency components of the self-mixed signal $S_{sm}$ are all down converted by the frequency division factor N, and then gain amplification and analog-to-digital conversion are performed for producing the desired ADC signal $S_{adc}$. It should be noted that any alternative design which uses the above equations or concept for computing, detecting and compensating frequency offset, no matter whether a digital, analog or mixed-signal based design, also falls within the scope of the invention. After entering the digital domain, a frequency computer is needed to compute anyone of the down converted third, fourth, and fifth frequencies. The frequency offset $f_s$ can then be obtained by using the operation circuit 215.

In this embodiment, the down converted fourth frequency can be employed as a target frequency, i.e. $(2/N)*(f_{osc} + f_s)$. Since the scale of the frequency offset $f_s$ is not significant in a general case, the down converted fourth frequency $(2/N)*(f+f_s)$ can be found in a specific range around the given $(2/N)*f_{osc}$, wherein the specific range should be configured to be a small range. In the specific range, the frequency with maximum power is identified as the down converted fourth frequency. After obtaining the down converted fourth frequency $(2/N)*(f_{osc}+f_s)$, the operation circuit 215 is in charge of performing a simple operation upon the down converted fourth frequency (i.e. multiplying the down converted fourth frequency by N/2, and subtracting the oscillation signal $S_{osc}$ from the product) to produce the frequency offset $f_s$. The procedure detailed in the above embodiment can be modified to achieve the same objective.

In another embodiment, the down converted third frequency can be employed as a target frequency, i.e. $(2/N)*(f_{osc}+f_s-f_{in})$. Similarly, the down converted third frequency $(2/N)*(f_{osc}+f_s-f_{in})$ can be found in a specific range around the given $(2/N)*(f(f_{osc}-f_{in}))$, wherein the specific range should be configured to be a small range. In the specific range, the frequency with maximum power is identified as the down converted third frequency. After obtaining the down converted third frequency $(2/N)*(f_{osc}+f_s-f_{in})$, the operation circuit 215 is in charge of performing a simple operation upon the down converted third frequency (i.e. multiplying the down converted fourth frequency by N/2, subtracting the oscillation signal $S_{osc}$ from the product, and then adding the difference and $f_{in}$) to produce the frequency offset $f_s$. Here, the extra component $f_{in}$ is given and can be changed arbitrarily, which is more flexible for frequency band selection in practice. In a case where a certain frequency band occupied by large noise happens to overlap with the frequency band under processing, the noise can be avoided by properly adjusting $f_{in}$. Please note that in another case where only the fourth frequency is detected (which means the third and the fifth frequency is discarded), it will not be affected by the input frequency $f_{in}$, and the input signal $S_{in}$ is therefore not required in the embodiment shown in FIG. 2. The frequency offset $f_s$ can be derived by self-mixing the oscillation signal $S_{osc}$, such that the mixer 203 may be omitted.

Figure 3:
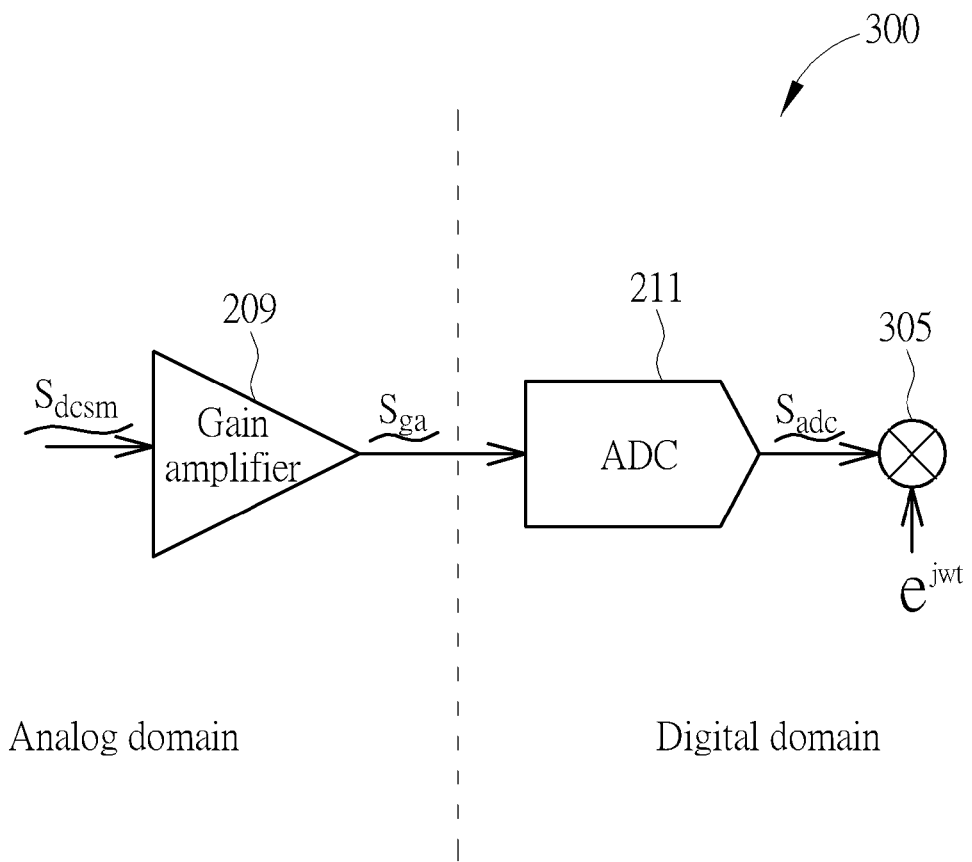
FIG. 3 is a diagram illustrating a circuit for compensating frequency offset of an oscillator according to an exemplary embodiment of the present invention.
Figure 4:
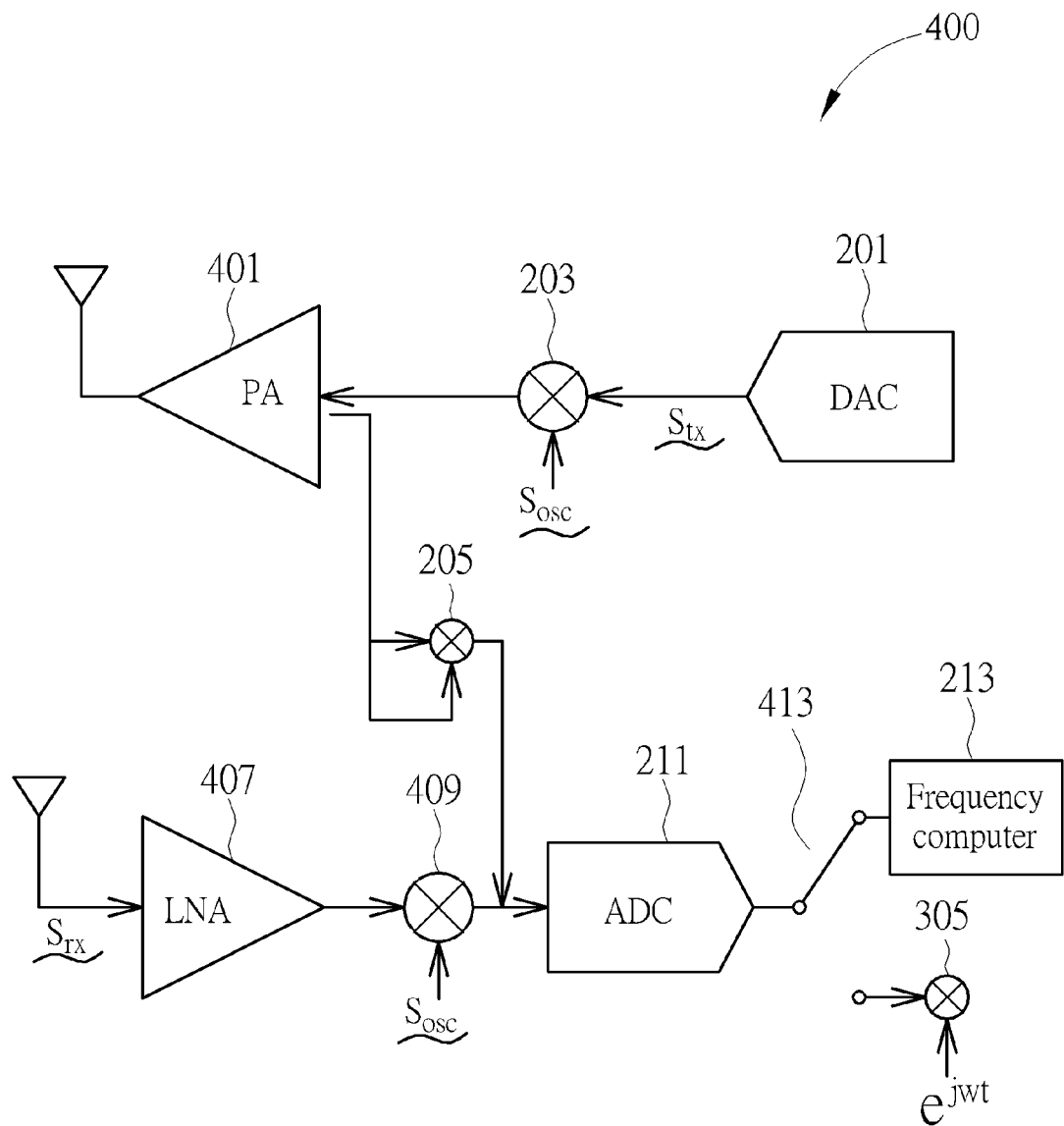
FIG. 4 is a diagram illustrating applying the disclosed oscillation frequency offset detection circuit to a transceiver according to an exemplary embodiment of the present invention.

FIG. 3 is a diagram illustrating a circuit for compensating frequency offset of an oscillator according to an exemplary embodiment of the present invention. The oscillation frequency offset compensation circuit 300 converts the down-converted self-mixing frequency $f_{dcsm}$ which needs to be compensated to the ADC signal $S_{adc}$ in the digital domain, and outputs the result in a format of $e^{j\omega t}$ (where $\omega=2*\pi*(\pm f_s)$, and $f_s$ is the frequency offset mentioned above) to a frequency mixer 305 located at the normal signal receiving path FIG. 4 is a diagram illustrating applying the disclosed oscillation frequency offset detection circuit to a transceiver according to an exemplary embodiment of the present invention. A portion of the oscillation frequency offset detection circuit 200 is depicted to disclose the characteristic of component sharing. A power amplifier (PA) 401, the mixer 203 and the DAC 201 of the transceiver 400 form a signal transmission path; a low noise amplifier (LNA) 407, a frequency mixer 409 and the ADC 211 of the transceiver 400 form a signal receiving path. The transceiver 400 further includes the self-mixer 205, a switch 413, the frequency computer 213 and the frequency mixer 307 (i.e. a compensation unit). In a frequency offset detection mode, the switch 413 couples the receiving path to the frequency computer 213, so that the mixer 203, the self-mixer 205 and the frequency computer 213 form a part of the oscillation frequency offset detection circuit of FIG. 2, enabling the oscillation frequency offset of the oscillation signal $S_{osc}$ to be obtained. For example, different frequency offsets corresponding to different temperatures may be stored into a storage device (e.g. a non-volatile memory). In a specific example, a look-up table of temperature versus frequency offset may be set up in the non-volatile memory, to allow fast frequency offset compensation via table lookup. When the crystal oscillator 216 operates at the temperature where the frequency offset has been detected, the control circuit 210 may directly use the frequency offset corresponding to the temperature stored in the storage device.

In a normal signal receiving mode, the signal transmission path is used to transmit a transmission signal $S_{tx}$, and the signal receiving path is used to receive a receiving signal $S_{rx}$. The switch 413 couples the signal receiving path to the frequency mixer 305, and allows the oscillation frequency offset to be compensated when the temperature varies.

Figure 5:
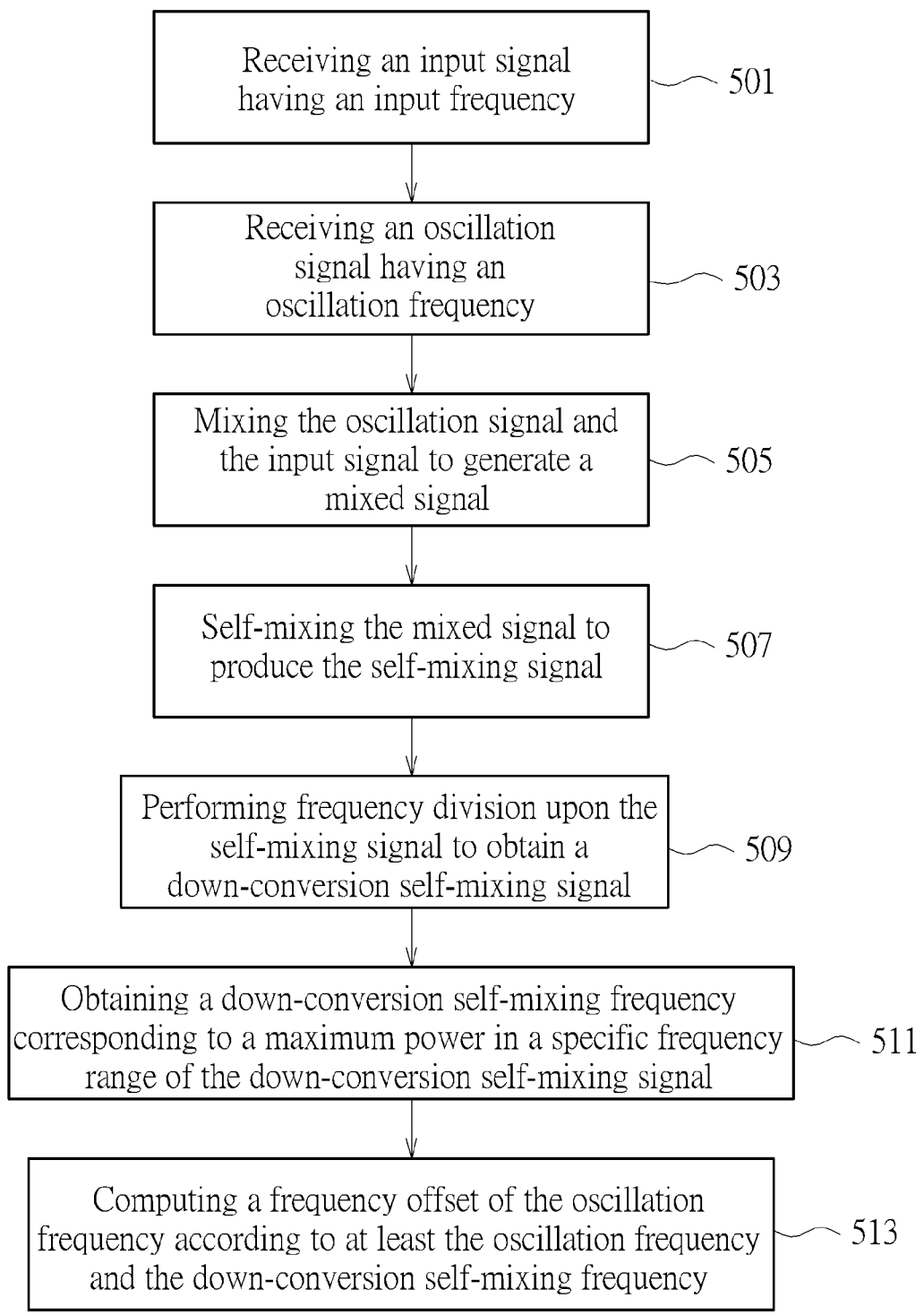
FIG. 5 is a flowchart illustrating a method for detecting frequency offset of an oscillator according to a first exemplary embodiment of the present invention.

FIG. 5 is a flowchart illustrating a method for detecting frequency offset of an oscillator according to a first exemplary embodiment of the present invention. Provided that substantially the same result is achieved, the steps of the flowchart shown in FIG. 5 need not be in the exact order shown and need not be contiguous; that is, other steps can be intermediate. Some steps in FIG. 5 may be omitted according to various embodiments or requirements. The oscillation frequency offset detection method 500 may be briefly summarized as follows.

Step 501: receive an input signal having an input frequency;

Step 503: receive an oscillation signal having an oscillation frequency;

Step 505: mix the oscillation signal and the input signal to generate a mixed signal;

Step 507: self-mix the mixed signal to produce the self-mixing signal;

Step 509: perform frequency division upon the self-mixing signal to obtain a down-converted self-mixing signal;

Step 511: obtain a down-converted self-mixing frequency corresponding to a maximum power in a specific frequency range of the down-converted self-mixing signal; and Step 513: compute a frequency offset of the oscillation frequency according to at least the oscillation frequency and the down-converted self-mixing frequency.

After reading the paragraphs relating to the oscillation frequency offset detection circuit 200, the steps in FIG. 5 should be readily understood. Details are hence omitted here for brevity. It should be noted that steps 501 and 505 may be bypassed in an alternative design which omits of the input signal $S_{in}$ as mentioned above. In this case, the step 513 should be modified to be: computing the frequency offset of the oscillation frequency according to the oscillation frequency and the down-converted self-mixing frequency.

Figure 6:
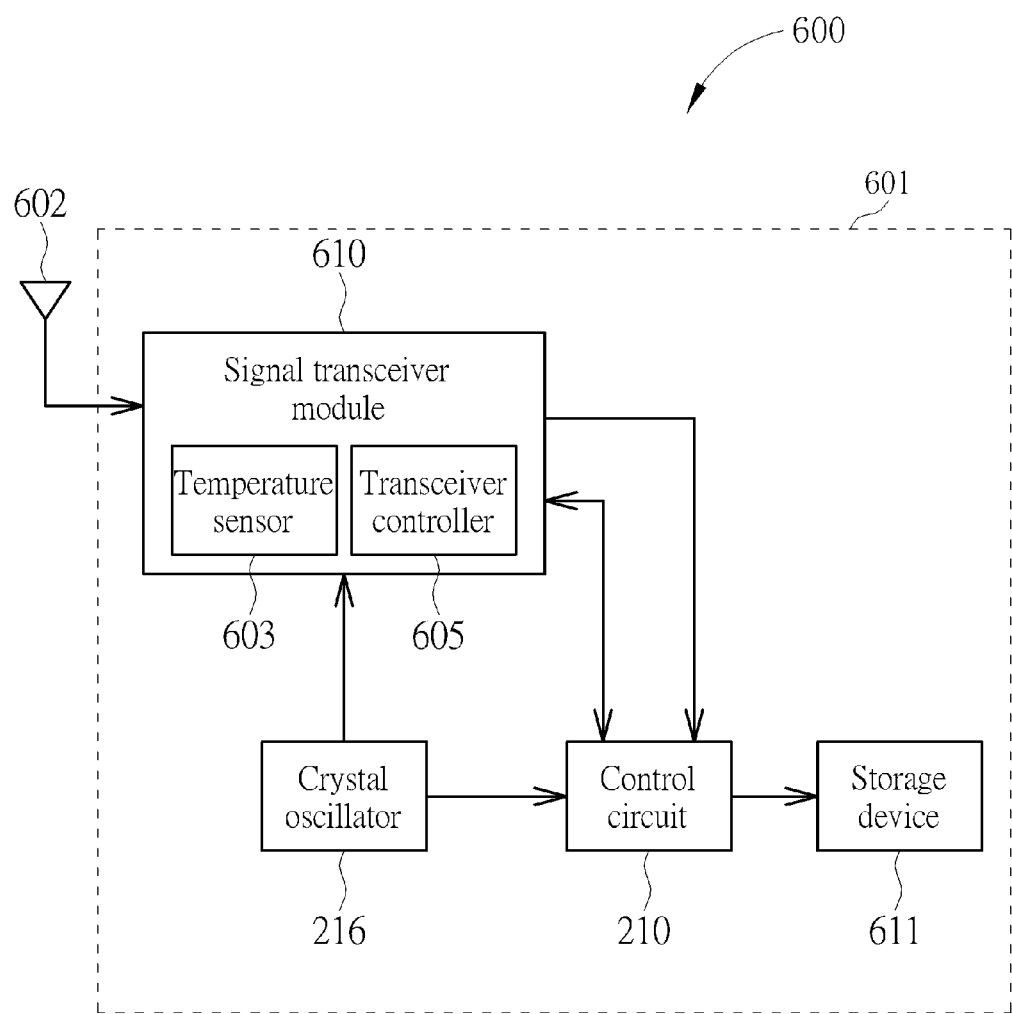
FIG. 6 is a diagram illustrating applying the transceiver shown in FIG. 4 to an electronic device according to an embodiment of the present invention.

FIG. 6 is a diagram illustrating applying the transceiver shown in FIG. 4 to an electronic device according to an embodiment of the present invention. The electronic 600 includes a signal transceiver 601 and an antenna 602. The signal transceiver 601 includes a signal transceiver module 610, a storage device 611, the crystal oscillator 216 and the control circuit 210. The signal transceiver 601 includes the circuit architecture of FIG. 4 and FIG. 2 (i.e. the signal transceiver 601 includes the inherent signal transceiving function but has extra capability of oscillation frequency offset detection and compensation), and further includes a temperature sensor 603 and a transceiver controller 605. The signal transceiver 601 is able to detect the oscillation frequency offset of the crystal oscillator 216 in a detection mode; and further perform signal transceiving and/or oscillation offset compensation in a normal mode. In this embodiment, the temperature sensor 603 detects a temperature T of the crystal oscillator 216, and sends the result to the control circuit 210 (e.g. the operation circuit 215 of the control circuit 210) via the transceiver controller 605. The control circuit 210 subsequently stores the frequency offset $f_s$ and the corresponding temperature T into the storage device 611 (e.g. a non-volatile memory). The control circuit 210 can therefore read the frequency offset from the storage device 611 directly according to the temperature T and proceeds with frequency compensation though the frequency mixer 305.

Figure 7:
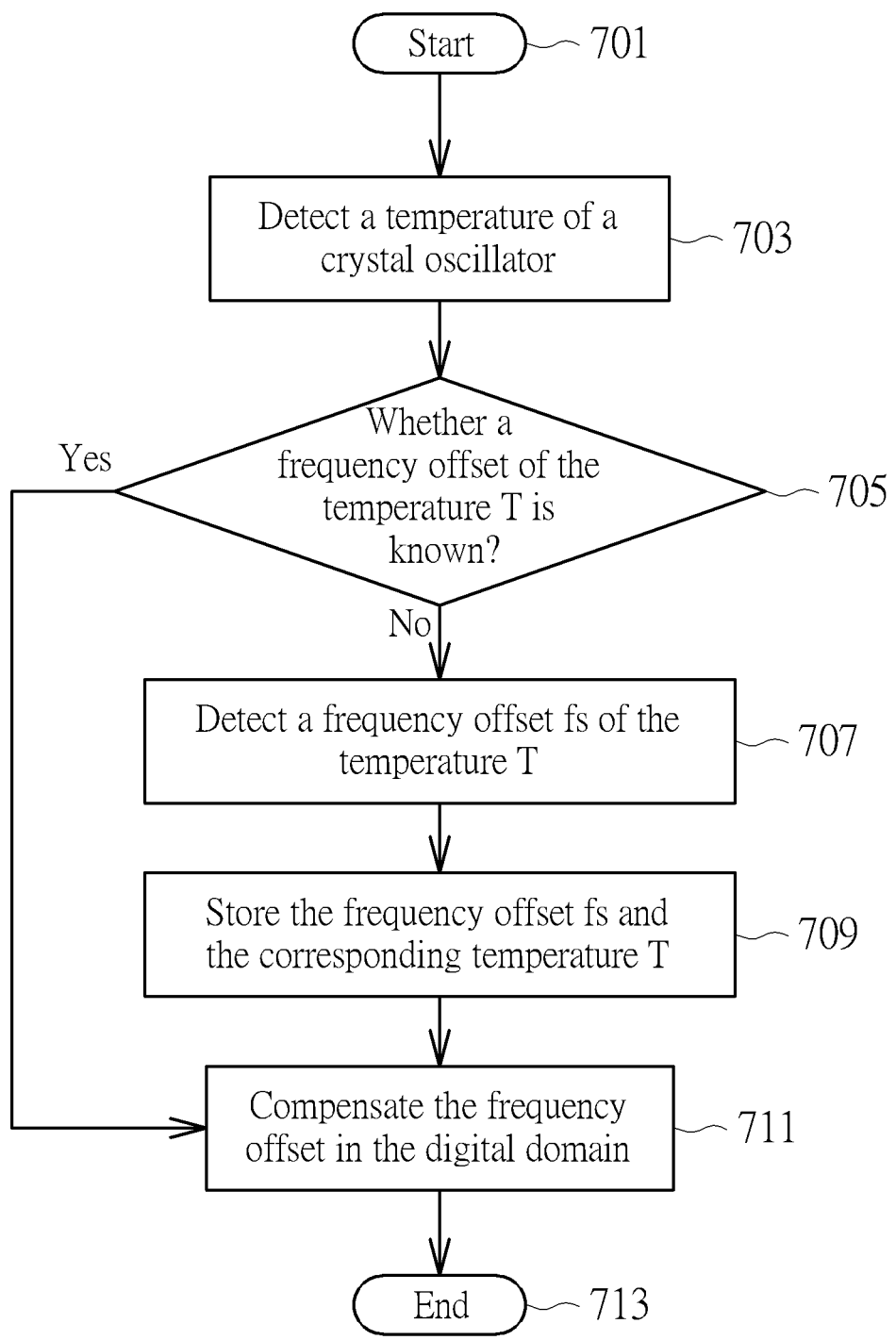
FIG. 7 is a flowchart illustrating a method for compensating frequency offset of an oscillator according to an exemplary embodiment of the present invention.

FIG. 7 is a flowchart illustrating a method for compensating frequency offset of an oscillator according to an exemplary embodiment of the present invention. Provided that substantially the same result is achieved, the steps of the flowchart shown in FIG. 7 need not be in the exact order shown and need not be contiguous; that is, other steps can be intermediate. Some steps in FIG. 7 may be omitted according to various embodiments or requirements. The oscillation frequency offset compensation method 700 may be implemented by the electronic device 600 and is briefly summarized as follows.

Step 701: start

Step 703: detect a temperature of a crystal oscillator;

Step 705: determine whether a frequency offset of the temperature T is known; if yes, go to step 711, else go to step 707;

Step 707: detect a frequency offset $f_s$ of the temperature T;

Step 709: store the frequency offset $f_s$ and the corresponding temperature T;

Step 711: compensate the frequency offset in the digital domain;

and

Step 713: end.

Please note that it may also be feasible to detect the temperature T and the corresponding frequency offset in real time, then proceed to step 711 directly without storing the detected result; in this alternative design, step 709 is therefore omitted.

The oscillation frequency offset detection circuit is not limited to detecting oscillation frequency offset introduced by change in temperature. Oscillation frequency offset induced by any other factors can also be detected. These other factors include crystal oscillator aging and manufacturing process drift. Through the disclosed frequency offset detection and compensation mechanisms, the frequency offset of the crystal oscillator may be detected and compensated dynamically in real time or by referring to values preset in the look-up table, to achieve the objectives of precision, low cost and long lifetime.

The disclosed circuit architectures in the embodiments may be implemented in various ways. For example, the above mentioned operations and flowcharts of the control circuit 211 may be achieved by hardware description language (e.g. Verilog or VHDL), by software codes executed by a CPU, or by firmware with a micro controller. It is also feasible to perform self-mixing upon the mixed signal twice to find another self-mixing frequency within a certain range around multiples of the oscillation frequency. Alternatively, the mixed signal may be replaced by the input signal for self-mixing operations.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for detecting frequency offset of an oscillator, comprising:

receiving an oscillation signal having an oscillation frequency;

generating a self-mixing signal according to the oscillation signal;

performing frequency division upon the self-mixing signal to obtain a down-converted self-mixing signal;

computing a down-converted self-mixing frequency corresponding to a maximum power in a specific frequency range of the down-converted self-mixing signal; and computing a frequency offset of the oscillation frequency according to at least the oscillation frequency and the down-converted self-mixing frequency.

2. The method of claim 1, further comprising:

receiving an input signal having an input frequency.

3. The method of claim 2, wherein the step of generating the self-mixing signal according to the oscillation signal comprises:

mixing the oscillation signal and the input signal to generate a mixed signal, and self-mixing the mixed signal to produce the self-mixing signal; and the step of computing the frequency offset comprises:

computing the frequency offset according to the oscillation frequency, the input frequency and the down-converted self-mixing frequency.

4. The method of claim 1, further comprising:

detecting a temperature of a crystal oscillator for generating the oscillation signal; and storing the frequency offset and the corresponding temperature.

5. The method of claim 4, further comprising:

when the crystal oscillator operates at the temperature again, applying the stored frequency offset directly.

6. The method of claim 1, wherein the step of computing the down-converted self-mixing frequency corresponding to the maximum power in the specific frequency range of the down-converted self-mixing signal comprises:

configuring the down-converted self-mixing frequency to enter into a digital domain; and computing the down-converted self-mixing frequency corresponding to the maximum power in the specific frequency range of the down-converted self-mixing signal.

7. The method of claim 6, wherein the step of computing the down-converted self-mixing frequency corresponding to the maximum power of the down-converted self-mixing signal comprises:

performing a Fourier transform upon the down-converted self-mixing signal to obtain the down-converted self-mixing frequency corresponding to the maximum power in the specific frequency range.

8. The method of claim 6, wherein the step of computing the down-converted self-mixing frequency corresponding to the maximum power of the down-converted self-mixing signal comprises:

performing a pattern correlation computation upon the down-converted self-mixing signal to obtain the down-converted self-mixing frequency corresponding to the maximum power in the specific frequency range.

9. The method of claim 1, wherein the down-converted self-mixing signal is generated by performing frequency division upon the self-mixing signal based on a frequency division factor; and the step of computing the frequency offset of the oscillation frequency comprise:

multiplying the down-converted self-mixing frequency by the frequency division factor, dividing a result by 2, and obtaining the frequency offset by comparing the result with the oscillation frequency.

10. The method of claim 1, wherein the specific frequency range is a fixed range close to a doubled oscillation frequency.

11. A circuit for detecting frequency offset of an oscillator, comprising:
- a self-mixer, arranged to generate a self-mixing signal according to a received oscillation signal having an oscillation frequency;
- a frequency divider, arranged to perform frequency division upon the self-mixing signal to obtain a down-converted self-mixing signal; and
- a control circuit, arranged to compute a down-converted self-mixing frequency corresponding to a maximum power in a specific frequency range of the down-converted self-mixing signal, and compute a frequency offset of the oscillation frequency according to at least the oscillation frequency and the down-converted self-mixing frequency.

12. The circuit of claim 11, further comprising:
- a mixer, arranged to mix the oscillation signal and the received input signal having an input frequency to generate a mixed signal;
- wherein the self-mixer self-mixes the mixed signal to produce the self-mixing signal; and the control circuit further computes the frequency offset according to the oscillation frequency, the input frequency and the down-converted self-mixing frequency.

13. The circuit of claim 11, further comprising:
- a thermal detector, arranged to detect a temperature of a crystal oscillator; and
- a storage device, arranged to store the frequency offset and the corresponding temperature.

14. The circuit of claim 13, wherein when the crystal oscillator operates at the temperature again, the control circuit applies the stored frequency offset directly.

15. The circuit of claim 11, wherein the control circuit comprises:
- an analog-to-digital converter, arranged to configure the down-converted self-mixing frequency to enter into a digital domain; and
- a frequency computer, arranged to compute the down-converted self-mixing frequency corresponding to the maximum power of the down-converted self-mixing signal.

16. The circuit of claim 15, wherein the frequency computer performs a Fourier transform upon the down-converted self-mixing signal to obtain the down-converted self-mixing frequency corresponding to the maximum power in the specific frequency range.

17. The circuit of claim 15, wherein the frequency computer performs a pattern correlation computation upon the down-converted self-mixing signal to obtain the down-converted self-mixing frequency corresponding to the maximum power in the specific frequency range.

18. The circuit of claim 11, wherein the down-converted self-mixing signal is generated by the frequency divider having a frequency division factor, which performs frequency division upon the self-mixing signal; and the control circuit comprises:
- an operation circuit, arranged to multiply the down-converted self-mixing frequency by the frequency division factor, divide a result by 2, and obtain the frequency offset by comparing the result with the oscillation frequency.

19. The circuit of claim 11, wherein the specific frequency range is a fixed range close to a doubled oscillation frequency.

* * * * *